(12) United States Patent  
Di et al.

(10) Patent No.: US 11,818,941 B2
(45) Date of Patent: Nov. 14, 2023

(54) MINI/MICRO PEROVSKITE LIGHT-EMITTING DIODE AND MANUFACTURING METHOD THEREOF

(71) Applicant: ZHEJIANG UNIVERSITY, Hangzhou (CN)

(72) Inventors: Dawei Di, Hangzhou (CN); Yaxiao Lian, Hangzhou (CN); Chungen Hsu, Hangzhou (CN); Shun Tian, Hangzhou (CN); Baodan Zhao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/072,584

(22) Filed: Nov. 30, 2022

(65) Prior Publication Data

US 2023/0105812 A1 Apr. 6, 2023

Related U.S. Application Data

(63) Continuation of application No. PCT/CN2022/076206, filed on Feb. 14, 2022.

(51) Int. Cl.
*H10K 71/00* (2023.01)
*H10K 59/122* (2023.01)
(Continued)

(52) U.S. Cl.
CPC ........... *H10K 71/00* (2023.02); *H10K 50/135* (2023.02); *H10K 50/15* (2023.02); *H10K 50/16* (2023.02);
(Continued)

(58) Field of Classification Search
CPC .... H10K 71/00; H10K 71/221; H10K 59/122; H10K 50/135; H10K 50/16; H10K 50/15; H10K 59/1201
(Continued)

(56) References Cited

U.S. PATENT DOCUMENTS

2013/0187138 A1* 7/2013 Matsumoto ............ H10K 50/13
438/34
2015/0028310 A1* 1/2015 Dai ........................ H10K 50/17
257/40
(Continued)

FOREIGN PATENT DOCUMENTS

CN 102782858 A 11/2012
CN 103915571 A 7/2014
(Continued)

OTHER PUBLICATIONS

Internation Search Report of PCT/CN2022/076206, dated May 7, 2022.

*Primary Examiner* — Dzung Tran (57) ABSTRACT

An optoelectronic device includes a semiconductor substrate, wherein a first transport layer is formed on a first partial region of the semiconductor substrate; a first insulation layer is formed on a second partial region around the first partial region; the first transport layer is formed on the first insulation layer; an interface layer is formed on the first transport layer; a light-emitting material layer containing perovskite material is formed on the interface layer; a second insulation layer is formed on the light-emitting material layer in the second partial region and on the light-emitting material layer near a second partial region side in the first partial region, so that the characteristic size of a single light-emitting pixel or effective working region is adjustable.

10 Claims, 6 Drawing Sheets

(51) Int. Cl.
*H10K 50/135* (2023.01)
*H10K 50/16* (2023.01)
*H10K 50/15* (2023.01)
*H10K 71/20* (2023.01)
*H10K 59/12* (2023.01)

(52) U.S. Cl.
CPC ......... *H10K 59/122* (2023.02); *H10K 71/221* (2023.02); *H10K 59/1201* (2023.02)

(58) Field of Classification Search
USPC .......................................................... 257/40
See application file for complete search history.

(56) References Cited

U.S. PATENT DOCUMENTS

| | | | |
|---|---|---|---|
| 2015/0303393 A1* | 10/2015 | Dai | H10K 71/231 |
| | | | 438/46 |
| 2016/0293675 A1* | 10/2016 | Kim | H10K 71/191 |
| 2017/0125745 A1* | 5/2017 | Lee | H10K 71/13 |
| 2018/0337359 A1 | 11/2018 | Kim et al. | |
| 2018/0366521 A1* | 12/2018 | Hu | H10K 50/11 |
| 2019/0267556 A1* | 8/2019 | Kim | H10K 85/633 |

FOREIGN PATENT DOCUMENTS

| | | |
|---|---|---|
| CN | 109923683 A | 6/2019 |
| CN | 110061107 A | 7/2019 |
| CN | 210224076 U | 3/2020 |
| CN | 111740019 A | 10/2020 |
| CN | 112103308 A | 12/2020 |
| CN | 113161499 A | 7/2021 |
| WO | 2020133161 A1 | 7/2020 |

* cited by examiner

MINI/MICRO PEROVSKITE LIGHT-EMITTING DIODE AND MANUFACTURING METHOD THEREOF

CROSS-REFERENCE TO RELATED APPLICATIONS

This application is a continuation of International Patent Application No. PCT/CN2022/076206 with a filing date of Feb. 14, 2022, designating the United States, now pending, and further claims priority to Chinese Patent Application No. 202110392494.2 with a filing date of Apr. 13, 2021. The content of the aforementioned applications, including any intervening amendments thereto, are incorporated herein by reference.

TECHNICAL FIELD

The present invention relates to a semiconductor technology, in particular to an optoelectronic device.

BACKGROUND OF THE PRESENT INVENTION

As requirements for miniaturization, integration and low power consumption of basic components of display products become higher, higher standards are required for unit size and low power consumption of micro optoelectronic devices such as light emitting diodes (LEDs). In recent years, mini and micro light-emitting diodes (mini-LED and micro-LED) have attracted extensive attention due to the advantages of low power consumption, high contrast, high luminance, high response speed, high efficiency and so on. Recently, some high-end miniaturized LED display have been brought to the market, such as "The Wall" display wall of SAMSUNG and "PixelLED display" of PlayNitride, which have been recognized by the industry. Although the existing mini-LED and micro-LED have the above advantages, the requirements on quality of III-V epitaxial semiconductors become stricter; and in a manufacturing process, a large number of non-radiative recombination loss channels will be formed on the side walls of a light-emitting layer, and problems of mass transfer of mini-LEDs in large panel displays will appear, thereby inevitably increasing the manufacturing cost of products.

In recent years, as novel semiconductor materials, metal halide perovskites have similar properties to III-V materials. As low-cost semiconductor materials which may be prepared by the solution-processed method, metal halide perovskites show excellent optoelectronic properties, such as adjustable band gap, high photoluminescence quantum yield, long carrier diffusion length and narrow band gap. Since room-temperature electroluminescent perovskite LEDs were first realized in 2014, the technology of preparing an efficient halide perovskite LED (PeLED) has become increasingly mature. Recently, researchers have successfully prepared perovskite light-emitting devices with external quantum efficiency (EQEs) over 20% and internal quantum efficiency close to 100%. Although PeLEDs are potential to become substitutes for low-cost LED technology, how to construct efficient PeLED technology with micro-pixel size is still difficult.

At present, two technical routes are available for preparing efficient PeLEDs: one is to optimize a radiative recombination process in low-dimensional and mixed-dimensional perovskite structures, and the other is to suppress a non-radiative recombination process in different material systems. Although perovskite light-emitting devices with high EQE may be prepared by passivating perovskite thin films and optimizing device structures, the preparation of efficient PeLED with a micron chip structure is still limited. The efficient PeLED has many disadvantages, such as the need to select spray ink with appropriate rheological properties, low-energy electron beam or solution with appropriate surface tension to prepare less easily damaged min-LED patterns.

In conclusion, how to prepare high-performance, light-emitting and optoelectronic devices with adjustable pixels or effective working regions by a low-cost process will become a future technical direction of the industry and an urgent demand of the market.

SUMMARY OF PRESENT INVENTION

The present application provides a manufacturing method of an optoelectronic device. A characteristic size of a single light-emitting pixel or effective working region of the optoelectronic device is less than or equal to 500 microns; the method comprises: S1: providing a semiconductor substrate; S2: forming a photoresist layer; S3: using a mask for exposing and developing the photoresist layer, so that a first partial region on the semiconductor substrate is protected by the remaining photoresist layer, and a second partial region around the first partial region is exposed; S4: forming a first insulation layer, wherein the first insulation layer covers an upper surface of the remaining photoresist layer and an upper surface of the semiconductor substrate corresponding to the second partial region, and the thickness of the photoresist layer is greater than that of the first insulation layer; S5: performing a photoresist stripping process to remove the remaining photoresist layer and the first insulation layer on the remaining photoresist layer; S6: forming a first transport layer, and making the first transport layer cover the upper surface of the first insulation layer and the semiconductor substrate in the first partial region; S7: forming an interface layer on the first transport layer; S8: forming a light-emitting material layer on the interface layer; S9: forming a second insulation layer, and making the second insulation layer cover a light-emitting material layer in the second partial region and a light-emitting material layer near a second partial region side in the first partial region, so that a central region in the first partial region is not covered by the second insulation layer; and S10: forming an electron transport layer in the central region of the first partial region.

Further, the method further comprises S11: forming a metal electrode on the electron transport layer in the central region of the first partial region, and extending the metal electrode to the second insulation layer at one side of the central region.

Further, the first transport layer is a hole transport layer.

Further, the interface layer is a lithium fluoride layer.

Further, the material of the first insulation layer is any one of silicon dioxide, aluminum oxide, silicon nitride, silicon carbide and aluminum nitride, or a combination of multiple materials.

Further, the light-emitting material layer is a perovskite material layer.

Further, the light-emitting material layer is a combination of perovskite materials and one or more of organic materials, III-V materials, II-VI materials, IV materials, rare earth materials, oxide materials, semiconductor nanomaterials and insulation materials.

Further, the light-emitting material layer is in direct contact with the interface layer.

Further, the size of the electron transport layer is adjusted by adjusting the size of the light-emitting material layer covered by the second insulation layer in the first partial region and adjusting the size of the central region not covered by the second insulation layer in the first partial region.

Further, the second insulation layer is a lithium fluoride layer.

Further, the position where the second insulation layer is formed is limited by the mask, so that only the light-emitting material layer near a second partial region side in the first partial region is covered by the second insulation layer.

Further, the position where the electron transport layer is formed is limited by the mask, so that the electron transport layer is only formed in the central region of the first partial region.

The present invention further provides an optoelectronic device, wherein a characteristic size of a single light-emitting pixel or effective working region of the optoelectronic device is less than or equal to 500 microns; the optoelectronic device comprises a semiconductor substrate, wherein a first transport layer is formed on a first partial region of the semiconductor substrate; a first insulation layer is formed on a second partial region around the first partial region; the first transport layer is formed on the first insulation layer; an interface layer is formed on the first transport layer; a light-emitting material layer is formed on the interface layer; a second insulation layer is formed on the light-emitting material layer in the second partial region and on the light-emitting material layer near a second partial region side in the first partial region; and an electron transport layer is formed on the light-emitting material layer in the central region in the first partial region.

Further, the first transport layer is a hole transport layer.

Further, the interface layer and the second insulation layer are lithium fluoride layers.

Further, the light-emitting material layer is a perovskite material layer.

Further, the light-emitting material layer is in direct contact with the interface layer.

Further, the size of the electron transport layer is adjusted by adjusting the size of the light-emitting material layer covered by the second insulation layer in the first partial region and adjusting the size of the central region not covered by the second insulation layer in the first partial region.

Further, the material of the first insulation layer is any one of silicon dioxide, aluminum oxide, silicon nitride, silicon carbide and aluminum nitride, or a combination of multiple materials.

DETAILED DESCRIPTION OF PREFERRED EMBODIMENTS

Technical solutions in embodiments in the present invention will be described clearly and completely below in combination with the accompanying drawings. Apparently, the described embodiments are part of embodiments of the present invention, but not all of the embodiments. All other embodiments obtained by those ordinary skilled in the art without contributing creative labor based on the embodiments of the present invention will fall within the protection scope of the present invention.

It should be understood that the present invention may be implemented in different forms and should not be construed as to be limited to the embodiments proposed here. On the contrary, these embodiments are provided to make the disclosure thorough and complete, and will fully convey the scope of the present invention to those skilled in the art. In the accompanying drawings, sizes and relative sizes of layers and regions may be exaggerated for clarity; and the same reference numerals indicate the same elements throughout. It should be understood that when an element or layer is referred to as being "on", "adjacent to", "connected to" or "coupled to" other elements or layers, the element or layer may be directly on, adjacent to, connected to or coupled to other elements or layers, or an intervening element or layer may exist. On the contrary, when an element is referred to as being "directly on", "directly adjacent to", "directly connected to" or "directly coupled to" other elements or layers, no intervening element or layer exists. It should be understood that although the terms such as first, second and third, may be used for describing various elements, components, regions, layers and/or parts, these elements, components, regions, layers and/or parts should not be limited by these terms. These terms are only used for distinguishing one element, part, region, layer or part from another element, component, region, layer or part. Therefore, without departing from teaching of the present invention, a first element, component, region, layer or part discussed below may be represented as a second element, component, region, layer or part.

Spatial relation terms such as "below", "under", "lower", "underneath", "above" and "upper" may be used here for the convenience of description to describe relations between one element or characteristic shown in figures and other elements or characteristics. It should be understood that, besides the orientations shown in the figures, the spatial relation terms are further intended to include different orientations of devices in use and operation. For example, if a device in the figures is turned upside down, then elements or characteristics described to be "below" or "under" or "underneath" other elements or characteristics will be oriented to be "above" other elements or characteristics. Therefore, the exemplary terms "below" and "under" may include both upper and lower orientations. The device may be otherwise oriented (rotated by 90 degrees or other orientations), and the spatial description used here is explained accordingly.

The terms used here are only available for describing specific embodiments and are not to be taken as a limitation to the present invention. As used here, "a", "an" and "said/the" representing singular forms are also intended to include plural forms, unless the context clearly indicates otherwise. It should also be understood that the terms "form" and/or "comprise" when used in the specification specify the presence of the characteristics, integers, steps, operations, elements and/or components, but do not exclude the presence or addition of one or more other characteristics, integers, steps, operations, elements, components and/or groups. As used here, the term "and/or" includes any and all combinations of related listed items.

Technical solutions in embodiments of the present invention will be described clearly and completely below in combination with the accompanying drawings. Apparently, the described embodiments are part of embodiments of the present invention, but not all of the embodiments. All other embodiments obtained by those ordinary skilled in the art without contributing creative labor based on the embodiments of the present invention will fall within the protection scope of the present invention.

Figure 1:
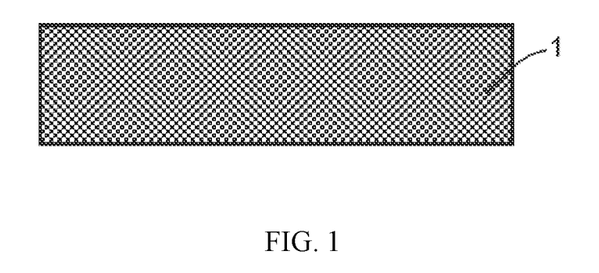
FIGS. 1-12 are sectional schematic diagrams of one of manufacturing processes of an optoelectronic device according to an embodiment of the present invention.

An embodiment of the present invention provides a manufacturing method of an optoelectronic device, wherein a characteristic size of a single light-emitting pixel or effective working region of the optoelectronic device is less than or equal to 500 microns. Taking PeLED as an example, generally, if the characteristic size of a single light-emitting pixel or effective working region is greater than or equal to 200 microns and less than 500 microns, the PeLED is a mini-PeLED; and if the characteristic size of a single light-emitting pixel or effective working region is less than or equal to 200 microns, the PeLED is a micro-PeLED. Please refer to sectional schematic diagrams of one of manufacturing processes of an optoelectronic device according to an embodiment of the present invention shown in FIGS. 1-12. Specifically, the manufacturing method of the optoelectronic device according to an embodiment of the present invention comprises:

S1: providing a semiconductor substrate;

As shown in FIG. 1, a semiconductor substrate 1 is provided; the semiconductor substrate 1 may be made of any material serviceable as a substrate, such as conductive glass (FTO), silicon substrate, polytetrafluoroethylene (PTFE) and piezoelectric ceramic.

Generally, the semiconductor substrate may be cleaned with deionized water, acetone, isopropanol, deionized water and isopropanol by five steps for 15 min before use. The cleaned semiconductor substrate is placed in a UV ozone cleaner for ozone cleaning for 30 min.

Figure 2:
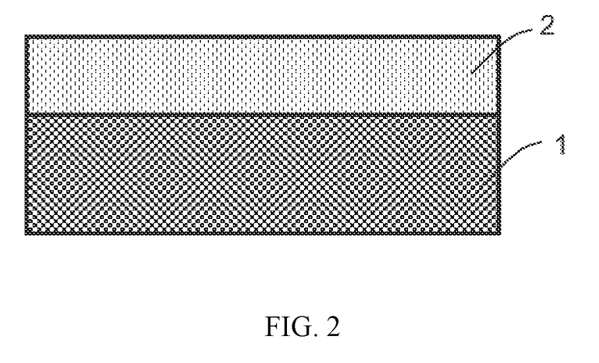

S2: forming a photoresist layer;

As shown in FIG. 2, a photoresist layer 2 is formed on the semiconductor substrate 1. The photoresist layer 2 may be formed by negative photoresist solution or positive photoresist solution. For example, 50 μL of negative photoresist solution may be sucked by a pipette with a measurement range of 100 μL, and coated on the semiconductor substrate 1; and a vacuum spin coater is turned on to spin-coat for 60 s at 4000 r.p.m., so that the photoresist layer 2 with a thickness of about 420 nm may be obtained. Preferably, the thickness of the photoresist layer 2 is 420 nm. Certainly, the thickness of the photoresist layer 2 may deviate from 420 nm; and the deviation may be 20%, preferably 10%, more preferably 5%. Specifically, the thickness may be any value between 380 nm and 460 nm.

Figure 4:
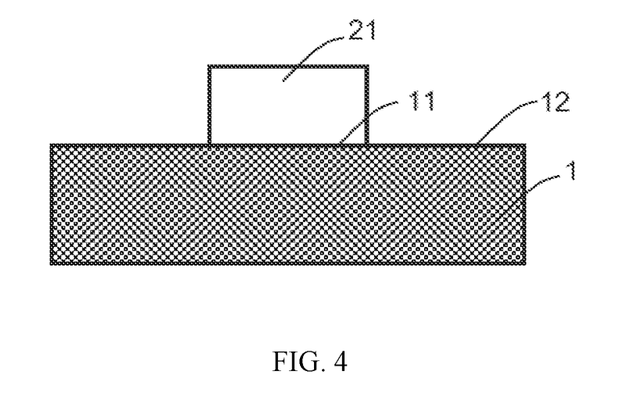

S3: using a mask for exposing and developing the photoresist layer, so that a first partial region on the semiconductor substrate is protected by the remaining photoresist layer, and a second partial region around the first partial region is exposed;

As shown in FIG. 4, the first partial region 11 on the semiconductor substrate 1 is protected by the remaining photoresist layer 21, and the second partial region 12 around the first partial region 11 is exposed, i.e., the semiconductor substrate 1 corresponding to the second partial region 12 is exposed.

Figure 3:
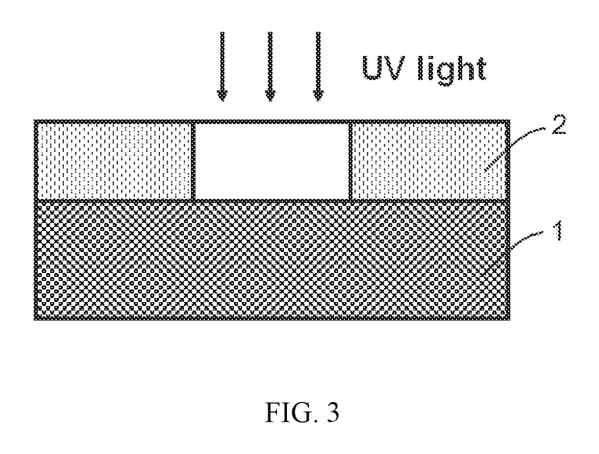

Specifically, taking the negative photoresist as an example, a structure formed after step S2 is placed on the mask and exposed with a UV light source (λ=365 nm, 100 mJ cm$^{-2}$) for 7-8 s to obtain an exposed negative photoresist as shown in FIG. 3. Then, the structure is rinsed with isopropyl alcohol (IPA) for several times to wash off the unexposed negative photoresist, and then baked on a heating stage at 85° C. for 20 min to obtain a structure as shown in FIG. 4.

Figure 5:
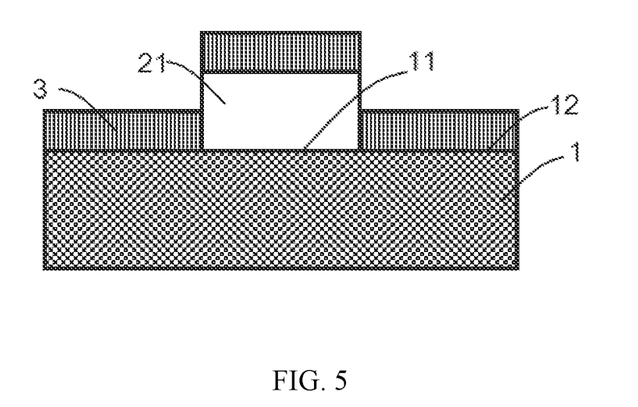

S4: forming a first insulation layer, wherein the first insulation layer covers an upper surface of the remaining photoresist layer and an upper surface of the semiconductor substrate corresponding to the second partial region, and the thickness of the photoresist layer is greater than that of the first insulation layer;

As shown in FIG. 5, a first insulation layer 3 is formed, the first insulation layer 3 covers the upper surface of the remaining photoresist layer 21 (i.e., the photoresist layer in the first partial region 11) and the upper surface of the exposed semiconductor substrate 1 (i.e., the semiconductor substrate corresponding to the second partial region 12); and the thickness of the photoresist layer 21 is greater than that of the first insulation layer 3. Specifically, in one embodiment, the thickness of the first insulation layer is any value between 40 nm and 80 nm. Preferably, the thickness of the first insulation layer is 60 nm.

In one embodiment, the material of the first insulation layer 3 may be any one of silicon dioxide ($SiO_2$), aluminum oxide ($Al_2O_3$), silicon nitride ($Si_3N_4$), silicon carbide (SiC) and aluminum nitride (AlN) or a combination of multiple materials. Preferably, the material of the first insulation layer 3 is silicon dioxide ($SiO_2$) or aluminum oxide ($Al_2O_3$). In one embodiment, the first insulation layer 3 is formed by at least one process of magnetron sputtering, MOCVD, thermal evaporation and the like.

Figure 6:
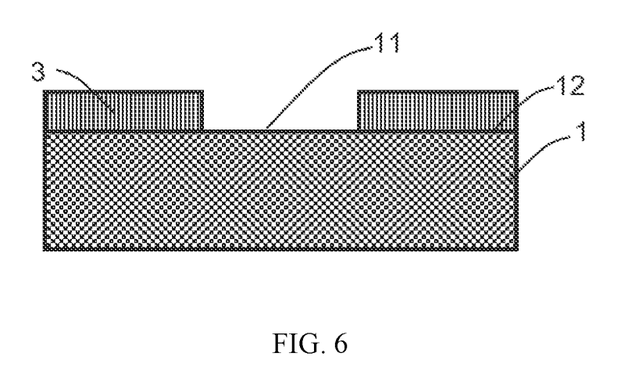

S5: performing a photoresist stripping process to remove the remaining photoresist layer and the first insulation layer on the remaining photoresist layer;

As shown in FIG. 6, the remaining photoresist layer 21 and the first insulation layer 3 on the remaining photoresist layer 21 are removed, so that the semiconductor substrate 1 in the first partial region 11 is exposed, while the first insulation layer 3 in the second partial region 12 is retained. Specifically, the structure formed in step S4 is soaked in a photoresist removing solution for 12 hours to remove the photoresist, so that a structure as shown in FIG. 6 is obtained. Then, the structure is sequentially rinsed with deionized water, acetone and isopropyl alcohol for 5 min, and is placed in the UV ozone cleaner for ozone cleaning for 30 min.

Figure 7:
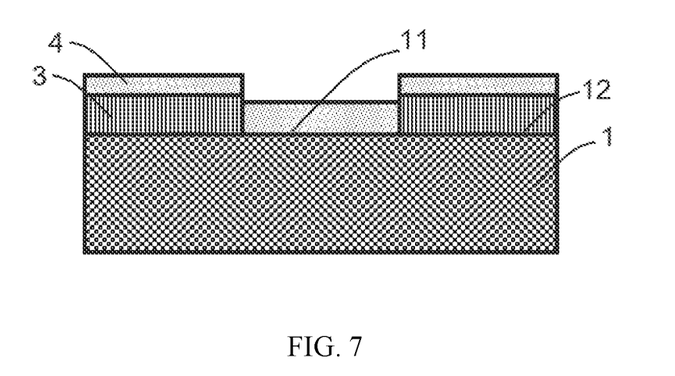

S6: forming a first transport layer, and making the first transport layer cover the upper surface of the first insulation layer and the semiconductor substrate in the first partial region;

Specifically, as shown in FIG. 7, the first transport layer 4 covers the upper surface of the first insulation layer 3 and the semiconductor substrate 1 in the first partial region 11.

In one embodiment, the first transport layer 4 is a hole transport layer. In one embodiment, the first transport layer comprises nickel oxide ($NiO_x$) and poly(9-vinylcarbazole) (PVK). Nickel oxide ($NiO_x$) powder may be purchased from Beijing HuaMin New Materials Technology Co., Ltd., and dispersed in deionized water, with a concentration of 15 mg/mL. 50 μL of $NiO_x$ solution is sucked with a pipette with a measurement range of 100 μL, and coated on the structure formed in step S5; a vacuum spin coater is turned on to spin-coat for 60 s at 4000 r.p.m.; and the structure spin-coated with $NiO_x$ is placed on the heating stage for annealing at 150° C. for 15 min. Then, the structure is transferred into a glove box filled with high-purity nitrogen, and is spin-coated with PVK on the vacuum spin coater. PVK is purchased from Sigma-aldrich, has an average molecular weight of 25,000-50,000, and is dissolved in chlorobenzene (CB), with a concentration of 6 mg/mL; 50 μL of PVK solution is sucked with a pipette with a measurement range of 100 μL for coating; the vacuum spin coater is turned on to spin-coat for 60 s at 4500 r.p.m.; and then the structure is placed on the heating stage for annealing at 150° C. for 30 min.

The hole transport layer may be an organic hole transport layer and an inorganic hole transport layer, wherein the organic hole transport layer includes, but is not limited to, at least one of TFB, PTAA, TAPC, PEDOT:PSS, Poly-TPD, PVK, TCTA, CBP, TPD, CuPc, M-MTDATA, NPB and Rubrene; and the inorganic hole transport layer includes, but is not limited to, at least one of copper oxide (CuO), nickel oxide ($NiO_x$), molybdenum trioxide ($MoO_3$), tungsten trioxide ($WO_3$) and vanadium pentoxide ($V_2O_5$).

In one embodiment, the thickness of the first transport layer 4 may be designed according to requirements of different devices.

Figure 8:
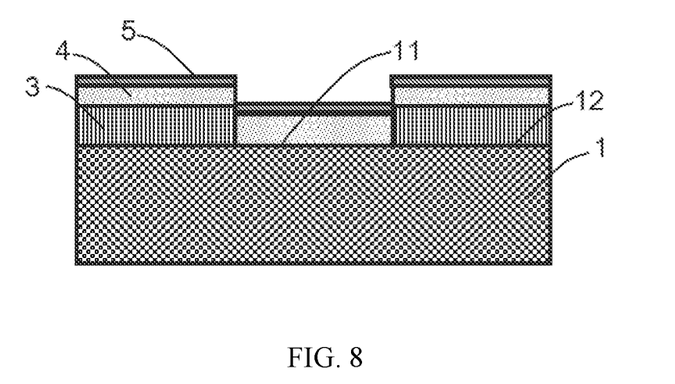

S7: forming an interface layer on the first transport layer;

As shown in FIG. 8, an interface layer 5 is formed on the first transport layer 4. In one embodiment, the interface layer 5 is a lithium fluoride (LiF) layer; and the interface layer 5 may be one or a combination of more of sodium fluoride (NaF), potassium fluoride (KF), rubidium fluoride (RbF), cesium fluoride (CsF), magnesium fluoride ($MgF_2$) and calcium fluoride ($CaF_2$). In one embodiment, the thickness of the interface layer 5 is any value between 0.7 nm and 1.3 nm; and preferably, the thickness of the interface layer 5 is 1 nm. In one embodiment, the structure formed in step S6 is transferred to a vacuum coater for evaporation of a polar interface, such as LiF. The vacuum evaporation pressure is $5\times10^{-4}$ Pa; the evaporation rate is measured by a quartz crystal resonator; and the evaporation rate is 0.1 nm/s until the evaporation is finished.

The interface layer 5 may play a role of insulation.

Figure 9:
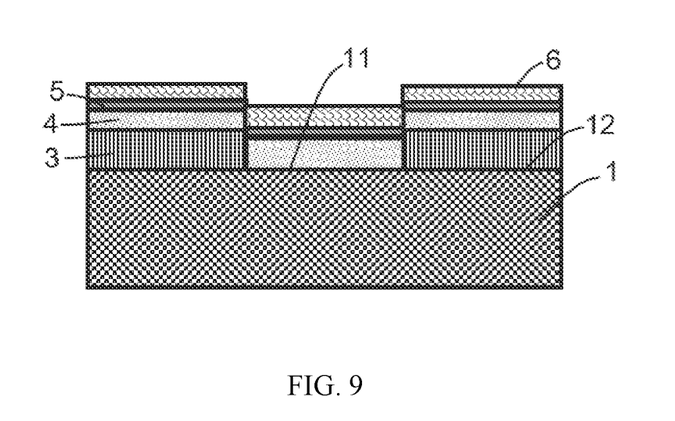

S8: forming a light-emitting material layer on the interface layer;

As shown in FIG. 9, a light-emitting material layer 6 is formed on the interface layer 5. The light-emitting material layer 6 may be made of any electroluminescent material; and any electroluminescent material currently available or produced with the development of technology falls within the protection scope of the present application, such as organic light-emitting materials, perovskite materials, quantum dot materials or the like. Preferably, in one embodiment, the light-emitting material layer 6 is a perovskite material layer. As a novel semiconductor material, metal halide perovskite has similar properties to III-V materials. As a low-cost semiconductor material which may be prepared by a solution method, metal halide perovskite shows excellent optoelectronic properties, such as adjustable band gap, high fluorescence quantum yield, long carrier diffusion length and narrow light-emitting band gap. In one embodiment, the light-emitting material layer is a combination of perovskite materials and one or more of organic materials, III-V materials, II-VI materials, IV materials, rare earth materials, oxide materials, semiconductor nanomaterials and insulation materials, wherein the organic materials include small molecules and polymers.

For example, the light-emitting material layer 6 is a perovskite material layer; and the structure formed after step S7 is transferred to a glove box filled with high-purity nitrogen, for being spin-coated with the perovskite material layer as the light-emitting material layer 6. Specifically, a perovskite precursor solution is $MOPEA_nCs_xFA_{1-x}PbnBr_{3n+1}$, which is formed by dissolving 110 mg of lead bromide ($PbBr_2$), 64 mg of cesium bromide (CsBr), 6 mg of formamidine hydroiodate (FABr) and 28 mg of 2-(4-methoxyphenyl)ethylamine hydrobromide (MOPEABr) and 5.5 mg of 18-crown-6 in 1 mL of dimethyl sulfoxide (DMSO) solution, with a solution concentration of 0.3 M. Then, 50 μL of the prepared 0.3 M perovskite precursor solution is sucked and coated on the interface layer 5 by spin-coating at 4000 r.p.m for 60 s; and the obtained structure is annealed at 70° C. for 10 min.

In one embodiment, a structural formula of the perovskite material layer is $ABX_3$, wherein the A site is a monovalent cation, the B site is a divalent cation, and the X site is a halogen anion. A-site cations include: cesium ion (CO, methylamine ion ($MA^+$), formamidine ion ($FA^+$), ethylamine ion ($EA^+$), hydrazine ion ($HA^+$), guanidine ion ($GA^+$), isopropylamine ion ($IPA^+$), imidazole ion ($IA^+$) and like. B-site cations include: lead ions ($Pb^{2+}$), tin ions ($Sn^{2+}$), germanium ions ($Ge^{2+}$), indium ions ($In^{2+}$), bismuth ions ($Bi^{2+}$) and the like. X-site anions include: chloride ion ($Cl^-$), bromide ion (Br), iodide ion ($I^-$) and the like. The perovskite material layer may be one or a combination of more of one-dimensional, quasi-two-dimensional and three-dimensional components.

In one embodiment, the thickness of the light-emitting material layer 6 may be designed according to requirements of different devices.

In addition, the light-emitting material layer 6 is located on the interface layer 5; specifically, the light-emitting material layer 6 is in direct contact with the interface layer 5, so that the light-emitting material is easier to spread, and the light-emitting material, such as perovskite solution, will be more closely combined with the interface layer 5 on the interface layer 5, thereby improving the flatness of the surface of the formed light-emitting material layer 6.

Figure 10:
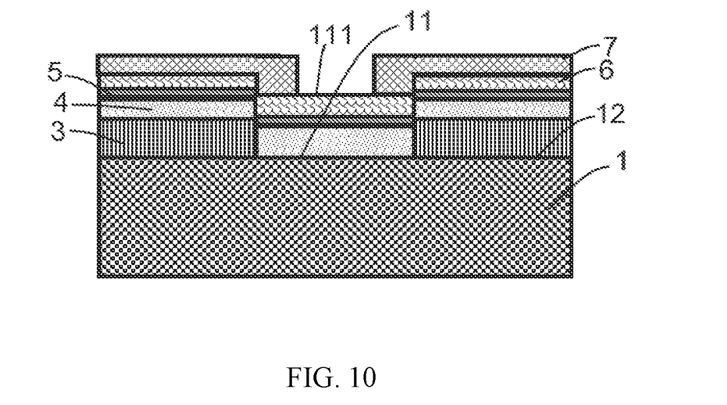

S9: forming a second insulation layer, and making the second insulation layer cover a light-emitting material layer in the second partial region and a light-emitting material layer near a second partial region side in the first partial region, so that a central region in the first partial region is not covered by the second insulation layer;

As shown in FIG. 10, the second insulation layer 7 covers the light-emitting material layer 6 in the second partial region 12 and the light-emitting material layer 6 near the second partial region 12 side in the first partial region 11, so that the light-emitting material layer 6 in the central region 111 in the first partial region 11 (i.e., a region other than the region covered by the second insulation layer 7 in the first partial region 11) is not covered by the second insulation layer 7, but the light-emitting material layer 6 in the central region 111 is exposed. In one embodiment, the size of the central region 111 not covered by the second insulation layer 7 in the first partial region 11 is adjusted by adjusting the size of the light-emitting material layer 6 covered by the second insulation layer 7 in the first partial region 11.

In one embodiment, the second insulation layer 7 is a lithium fluoride (LiF) layer; and the second insulation layer 7 may be one or a combination of more of sodium fluoride (NaF), potassium fluoride (KF), rubidium fluoride (RbF), cesium fluoride (CsF), magnesium fluoride ($MgF_2$), calcium fluoride ($CaF_2$) and the like. In one embodiment, the thickness of the second insulation layer 7 is any value between 24 nm and 36 nm; and preferably, the thickness of the second insulation layer 7 is 30 nm. In one embodiment, the structure formed in step S8 is placed in the vacuum coater for evaporation of lithium fluoride (LiF) insulation layer; the vacuum evaporation pressure is $5\times10^{-4}$ Pa; the evaporation rate is measured by a quartz crystal resonator; and the evaporation rate is 0.4 nm/s until the evaporation is finished. In one embodiment, the position where the second insulation layer 7 is formed is limited by a mask, so that the first partial region 11 is not completely covered by the second insulation layer 7, and only the light-emitting material layer near the second partial region 12 side is covered by the second insulation layer 7.

S10: forming an electron transport layer in the central region of the first partial region.

Figure 11:
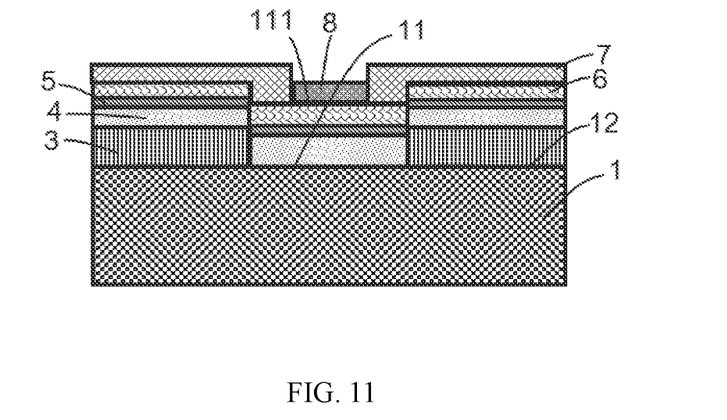

As shown in FIG. 11, the electron transport layer 8 is formed, so that the formed electron transport layer 8 only covers the central region 111 in the first partial region 11.

In one embodiment, the electron transport layer 8 is formed by an evaporation process. The name of the electron transport layer 8 is 2, 2′, 2″-(1, 3, 5-benzimidazole)-tri(1-phenyl-1-H-benzimidazole) (TPBi); the vacuum evaporation pressure is $5 \times 10^{-4}$ Pa; the evaporation rate is measured by a quartz crystal resonator; and the evaporation rate is 0.4 nm/s until the evaporation is finished. In one embodiment, the thickness of the electron transport layer 8 is any value between 40 nm and 50 nm; and preferably, the thickness of the electron transport layer 8 is 45 nm.

In one embodiment, the position where the electron transport layer 8 is formed is limited by a mask, so that the electron transport layer 8 is only formed in the central region 111 in the first partial region 11.

The electron transport layer 8 may be divided into two categories: organic electron transport layer and inorganic electron transport layer, wherein the organic electron transport layer includes, but is not limited to, at least one of TPBi, BAlq, Phen-m-PhDPO, POPy$_2$, PO-T2T, Alq$_3$, B$_3$PYMPM and the like; and the inorganic electron transport layer includes, but is not limited to, at least one of Ga$_2$O$_3$, Si$_3$N$_4$, ZrO$_2$, V$_2$O$_5$, Al$_2$O$_3$, NiO$_x$, MoO$_3$, ZnO, MgO, NiO, SnO$_2$, TiO$_2$ and the like.

As mentioned above, in the present application, the size of the light-emitting material layer 6 covered by the second insulation layer 7 in the first partial region may be adjusted, so that the size of the subsequently formed electron transport layer may be adjusted, i.e., a light-emitting area of the optoelectronic device may be adjusted; further, the characteristic size of a single light-emitting pixel or effective working region may be adjusted, i.e., the second insulation layer is taken as a characteristic size limiting layer and is combined with the first insulation layer to realize mini and micro optoelectronic devices, thereby not only optimizing the structure of the devices, but also solving problems of low EQE, low luminance and large leakage current of mini and micro optoelectronic devices; and in addition, the optoelectronic device provided by the present application is manufactured without an etching process, to avoid defects of many dead pixels, difficult processing, long time consumption and the like of the optoelectronic devices in mass preparation due to serious damage to the light-emitting material layers caused by chemical corrosion and ion beam or electron beam etching in the etching process.

In one embodiment, further, the manufacturing method of the optoelectronic device also comprises: S11: forming a metal electrode on the electron transport layer in the central region of the first partial region, and extending the metal electrode to the second insulation layer at one side of the central region.

Figure 12:
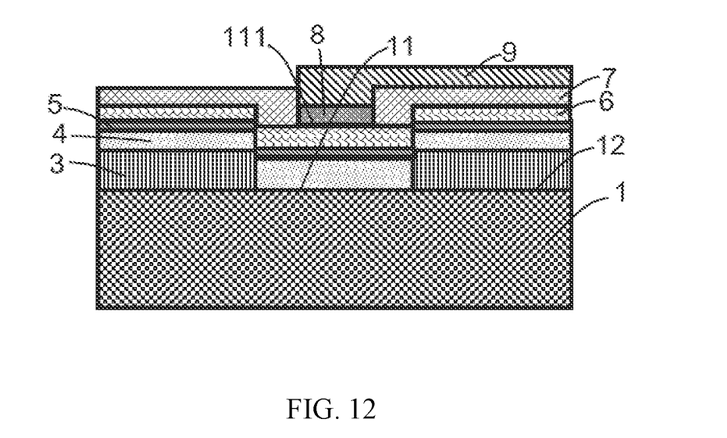

As shown in FIG. 12, the metal electrode 9 covers the electron transport layer 8 in the central region 111 of the first partial region 11, and extends to the second insulation layer 7 at a right side of the central region 111, to form a strip-shaped metal electrode 9.

In one embodiment, the metal electrode 9 is formed by a metal electrode evaporation process. In one embodiment, a region where the metal electrode 9 is formed is limited by a mask. In one embodiment, the width of the metal electrode 9 is any value between 150 μm and 250 μm. In one embodiment, an electrode material LiF and metal Al are sequentially evaporated in the process of metal electrode evaporation; the evaporation rate is measured by a quartz crystal resonator; the evaporation rate of LiF is 0.1 nm/s; the thickness of LiF is any value between 0.8 nm and 1.2 nm; and the thickness of Al electrode is any value between 80 nm and 120 nm. Preferably, the thickness of LiF is 1 nm; and the thickness of Al electrode is 100 nm. In one embodiment, the metal electrode has high-conductivity oxides and metal materials; the high-conductivity oxides include transparent electrodes such as ITO, FTO and TCO; and the metal materials include Al, Mg, Ca, Ag, Cu, Mg:Ag, Li:Al, Mn and the like.

Please continue to refer to FIG. 12, one embodiment of the present invention further provides an optoelectronic device. The characteristic size of a single light-emitting pixel or effective working region of the optoelectronic device is less than or equal to 500 microns; and the optoelectronic device comprises:

a semiconductor substrate 1, wherein a first transport layer 4 is formed on a first partial region 11 of the semiconductor substrate 1; a first insulation layer 3 is formed on a second partial region 12 around the first partial region 11; and the first transport layer 4 is formed on the first insulation layer 3;

An interface layer 5 is formed on the first transport layer 4;

A light-emitting material layer 6 is formed on the interface layer 5;

A second insulation layer 7 is formed on the light-emitting material layer 6 in the second partial region 12 and on the light-emitting material layer 6 near a second partial region 12 side in the first partial region 11; and an electron transport layer 8 is formed on the light-emitting material layer 6 in the central region 111 in the first partial region 11.

In one embodiment, the thickness of the first insulation layer is any value between 40 nm and 80 nm; the thickness of the interface layer is any value between 0.7 nm and 1.3 nm; the thickness of the second insulation layer is any value between 24 nm and 36 nm; and the thickness of the electron transport layer is any value between 40 nm and 50 nm. Preferably, the thickness of the first insulation layer is 60 nm; the thickness of the interface layer 5 is 1 nm; the thickness of the second insulation layer 7 is 30 nm; and the thickness of the electron transport layer 8 is 45 nm.

In one embodiment, the thicknesses of the first transport layer 4 and the light-emitting material layer 6 may be designed according to requirements of different devices.

In one embodiment, the semiconductor substrate 1 may be made of any material serviceable as a substrate, such as conductive glass, silicon substrate, polytetrafluoroethylene (PTFE) and piezoelectric ceramic.

In one embodiment, the material of the first insulation layer 3 may be any one of silicon dioxide (SiO$_2$), aluminum oxide (Al$_2$O$_3$), silicon nitride (Si$_3$N$_4$), silicon carbide (SiC) and aluminum nitride (AlN) or a combination of multiple materials. Preferably, the material of the first insulation layer 3 is silicon dioxide (SiO$_2$) or aluminum oxide (Al$_2$O$_3$).

In one embodiment, the first transport layer 4 is a hole transport layer. In one embodiment, the first transport layer comprises nickel oxide ($NiO_x$) and poly(9-vinylcarbazole) (PVK). The hole transport layer may be an organic hole transport layer and an inorganic hole transport layer, wherein the organic hole transport layer includes, but is not limited to, at least one of TFB, PTAA, TAPC, PEDOT:PSS, Poly-TPD, PVK, TCTA, CBP, TPD, CuPc, M-MTDATA, NPB and Rubrene; and the inorganic hole transport layer includes, but is not limited to, at least one of copper oxide (CuO), nickel oxide ($NiO_x$), molybdenum trioxide ($MoO_3$), tungsten trioxide ($WO_3$) and vanadium pentoxide ($V_2O_5$).

In one embodiment, the interface layer 5 is a lithium fluoride (LiF) layer; and the interface layer 5 may be one or a combination of more of sodium fluoride (NaF), potassium fluoride (KF), rubidium fluoride (RbF), cesium fluoride (CsF), magnesium fluoride ($MgF_2$) and calcium fluoride ($CaF_2$). The interface layer 5 may play a role of insulation.

The light-emitting material layer 6 may be made of any electroluminescent material; and any electroluminescent material currently available or produced with the development of technology falls within the protection scope of the present application, is preferably a perovskite material, may also be a combination of perovskite material and one or more of organic materials, III-V materials, II-VI materials, IV materials, rare earth materials, oxide materials, semiconductor nanomaterials, insulation materials and the like. Preferably, in one embodiment, the light-emitting material layer 6 is a perovskite material layer. As a novel semiconductor material, metal halide perovskite has similar properties to III-V materials. As a low-cost semiconductor material which may be prepared by a solution method, metal halide perovskite shows excellent optoelectronic properties, such as adjustable band gap, high fluorescence quantum yield, long carrier diffusion length and narrow light-emitting band gap. In one embodiment, a structural formula of the perovskite material layer is $ABX_3$, wherein the A site is a monovalent cation, the B site is a divalent cation, and the X site is a halogen anion. A-site cations include: cesium ion (CO, methylamine ion ($MA^+$), formamidine ion ($FA^+$), ethylamine ion ($EA^+$), hydrazine ion ($HA^+$), guanidine ion ($GA^+$), isopropylamine ion ($IPA^+$), imidazole ion ($IA^+$) and like. B-site cations include: lead ions ($Pb^{2+}$), tin ions ($Sn^{2+}$), germanium ions ($Ge^{2+}$), indium ions ($In^{2+}$), bismuth ions ($Bi^{2+}$) and the like. X-site anions include: chloride ion ($Cl^-$), bromide ion (Br), iodide ion ($I^-$) and the like. The perovskite material layer may be one or a combination of more of one-dimensional, quasi-two-dimensional and three-dimensional components.

In addition, the light-emitting material layer 6 is located on the interface layer 5; specifically, the light-emitting material layer 6 is in direct contact with the interface layer 5, so that the light-emitting material is easier to spread, and the light-emitting material, such as perovskite solution, will be more closely combined with the interface layer 5 on the interface layer 5, thereby improving the flatness of the surface of the formed light-emitting material layer 6.

As shown in FIG. 12, the second insulation layer 7 covers the light-emitting material layer 6 in the second partial region 12 and the light-emitting material layer 6 near the second partial region 12 side in the first partial region 11, so that the light-emitting material layer 6 in the central region 111 in the first partial region 11 is not covered by the second insulation layer 7, but the light-emitting material layer 6 in the central region 111 is exposed. In one embodiment, the size of the central region 111 not covered by the second insulation layer 7 in the first partial region 11 is adjusted by adjusting the size of the light-emitting material layer 6 covered by the second insulation layer 7 in the first partial region 11.

In one embodiment, the second insulation layer 7 is a lithium fluoride (LiF) layer; and the second insulation layer 7 may be one or a combination of more of sodium fluoride (NaF), potassium fluoride (KF), rubidium fluoride (RbF), cesium fluoride (CsF), magnesium fluoride ($MgF_2$), calcium fluoride ($CaF_2$) and the like.

As shown in FIG. 12, the electron transport layer 8 only covers the central region 111 in the first partial region 11. The electron transport layer 8 may be divided into two categories: organic electron transport layer and inorganic electron transport layer, wherein the organic electron transport layer includes, but is not limited to, at least one of TPBi, BAlq, Phen-m-PhDPO, $POPy_2$, PO-T2T, $Alq_3$, B3PYMPM and the like; and the inorganic electron transport layer includes, but is not limited to, at least one of $Ga_2O_3$, $Si_3N_4$, $ZrO_2$, $V_2O_5$, $Al_2O_3$, $NiO_x$, $MoO_3$, ZnO, MgO, NiO, $SnO_2$, $TiO_2$ and the like.

In the present application, the size of the light-emitting material layer 6 covered by the second insulation layer 7 in the first partial region may be adjusted, so that the size of the subsequently formed electron transport layer may be adjusted, i.e., a light-emitting area of the optoelectronic device may be adjusted; further, the characteristic size of a single light-emitting pixel or effective working region may be adjusted, i.e., the second insulation layer is taken as a characteristic size limiting layer and is combined with the first insulation layer to realize mini and micro optoelectronic devices, thereby not only optimizing the structure of the devices, but also solving problems of low EQE, low luminance and large leakage current of mini and micro optoelectronic devices.

In one embodiment, further, the optoelectronic device also comprises a metal electrode 9; and the metal electrode 9 covers the electron transport layer 8 in the central region 111 of the first partial region 11 and extends to the second insulation layer 7 at one side of the central region 111.

In one embodiment, the optoelectronic device is an LED. However, the optoelectronic device provided by the present invention may also be extended to other optoelectronic device fields, including but not limited to solar cells, photodetectors, fluorescent films, phosphor powder, semiconductor transistors, laser optoelectronic devices and materials and the like. The mini and micro LEDs manufactured by the method provided by the present application may be applied to displays screens (screens of electronic products such as high-end televisions, mobile phones, computers and iPad), smart watches, wearable devices, AR smart glasses, mini-projectors and the like. The mini and micro LEDs may also be combined with a flexible substrate to realize flexible display. The mini LEDs may also be used for realizing backlight displays (TV screens, car monitors and the like), RGB small-pitch displays and the like.

The optoelectronic device provided by the present application and the optoelectronic device formed by the manufacturing method of the optoelectronic device provided by the present application are tested. For example, the optoelectronic device is an LED; the EQE is tested with an OLED photoelectric test system; the system consists of a luminance meter, a Keithley 2400 source meter, an upper computer, an industrial control camera CCD, a sample test bench and the like; the luminance meter is used for detecting a spectrum and spectral power of an LED; as a power source of the LED, the Keithley 2400 source meter is responsible for power output and current detection; positive and negative wires of the Keithley 2400 source meter are led out to be connected with positive and negative electrodes of the LED; the voltage loaded to light-emitting device is 1 V-5 V; the voltage step interval is 0.1 V; current passing through the LED is measured by a four-wire method; a current detection range is 1 nA-100 mA; and a current density range is $10^{-4}$-$10^3$ mA cm$^{-2}$, so that the current testing requirements of the LED may be satisfied. The upper computer realizes a function of interactive communication with the luminance meter, Keithley 2400 source meter and industrial control camera CCD, acquires the collected spectrum, spectral power, voltage, current and detection images, and realizes the real-time display function; and the sample test bench is responsible for placing LED samples and achieves a function of three-dimensional position adjustment, so that clearer observation and more accurate measurement are realized, thereby achieving a purpose of optimal property test.

Figure 13A:
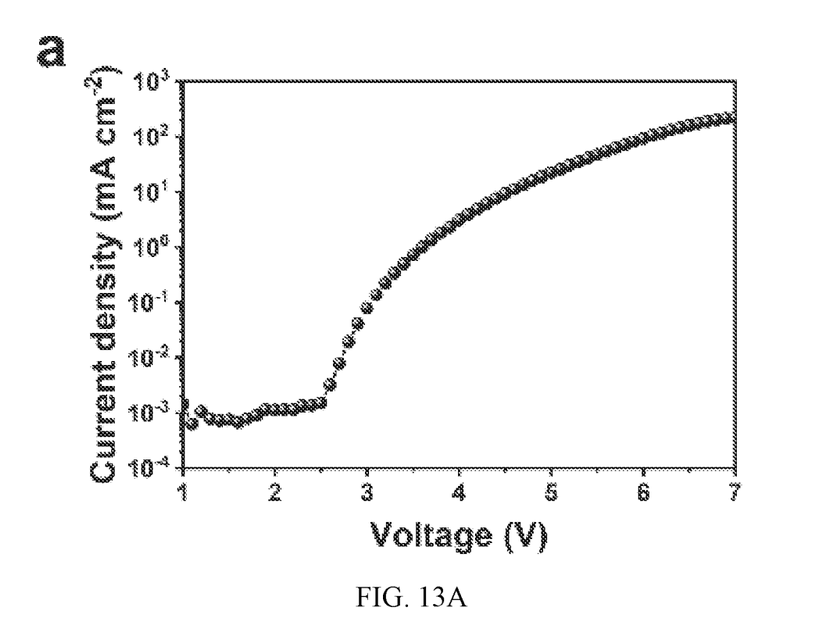
FIGS. 13A, 13B, and 13C are schematic diagrams of optoelectronic property test data of an optoelectronic device according to an embodiment of the present application and an optoelectronic device formed by manufacturing the optoelectronic device according to an embodiment of the present application.
Figure 13B:
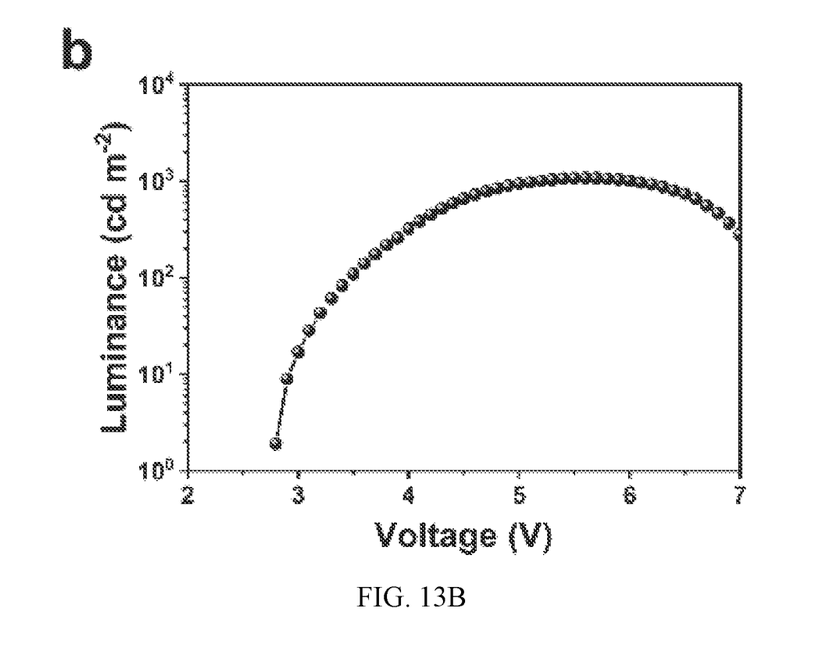
Figure 13C:
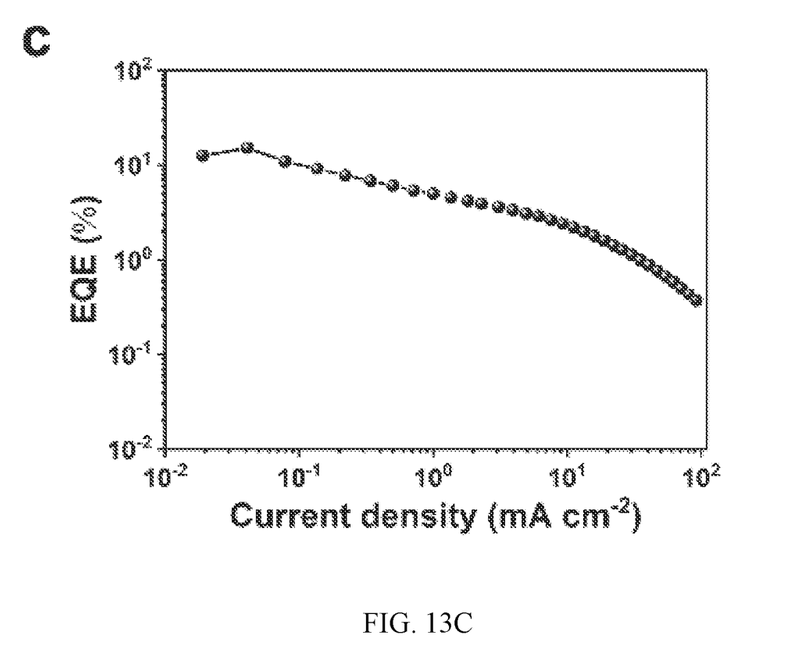

FIGS. 13A, 13B, and 13C are schematic diagrams of optoelectronic property test data of an optoelectronic device according to an embodiment of the present application and an optoelectronic device formed by manufacturing the optoelectronic device according to an embodiment of the present application. A horizontal axis in FIG. 13A represents the voltage loaded to two ends of the LED, in volt (V); and a vertical axis represents the current density flowing through the LED, in mA cm$^{-2}$. A lighting voltage of a mini LED is 2.8 V. When the voltage is 6.0 V, the current density reaches 923.8 mA cm$^{-2}$. A horizontal axis in FIG. 13B represents the voltage loaded to two ends of the LED, in volt (V); a vertical axis represents the luminance of LED, in cd m$^{-2}$. When the voltage is 5.7 V, the luminance of LED reaches 1070.5 cd m$^{-2}$; and the area of a light-emitting region is 0.04 mm$^2$. A horizontal axis in FIG. 13C represents a current density flowing through the LED, in mA cm$^{-2}$; and a vertical axis represents the EQE of the LED, in %. A maximum EQE of the micro LED is about 15.2% ($4.11 \times 10^{-2}$ mA cm$^{-2}$). Therefore, the optoelectronic device provided by the present application and the optoelectronic device formed by manufacturing the optoelectronic device provided by the present application not only realize miniaturization and microminiaturization, but also solve the problems of low EQE, low luminance and large leakage current of mini and micro optoelectronic devices.

In one embodiment, the optoelectronic device and the manufacturing method of the optoelectronic device provided by the present application are applicable to mini and micro optoelectronic devices, wherein the characteristic size of a single light-emitting pixel or effective working region is greater than or equal to 200 microns and less than or equal to 500 microns; and the characteristic size of a single light-emitting pixel or effective working region is less than or equal to 200 microns.

Further, the optoelectronic device provided by the present application may also be manufactured by: a method I of directly preparing the optoelectronic device on a mini or micro substrate with a size of less than or equal to 500 microns, or a method II of preparing an optoelectronic device with conventional size by an etching method, wherein the etching method includes laser processing, plasma etching, FIB etching, EBL etching and the like.

Finally, it should be stated that the above embodiments are only used for explaining the technical solutions of the present invention, rather than limiting the present invention. Although the present invention is described in detail with reference to the above embodiments, those ordinary skilled in the art should understand that the technical solutions recorded in the above embodiments may still be modified, or part or all of technical features may be equivalently replaced; and the modifications or substitutions will not make essence of the corresponding technical solutions depart from the scope of the technical solutions in various embodiments of the present invention.

We claim:

1. A manufacturing method of an optoelectronic device, wherein a characteristic size of a single light-emitting pixel or effective working region of the optoelectronic device is less than or equal to 500 microns, and the manufacturing method comprises:
    S1: providing a semiconductor substrate;
    S2: forming a photoresist layer;
    S3: using a mask for exposing and developing the photoresist layer, so that a first partial region on the semiconductor substrate is protected by the remaining photoresist layer, and a second partial region around the first partial region is exposed;
    S4: forming a first insulation layer, wherein the first insulation layer covers an upper surface of the remaining photoresist layer and an upper surface of the semiconductor substrate corresponding to the second partial region, and the thickness of the photoresist layer is greater than the thickness of the first insulation layer;
    S5: performing a photoresist stripping process to remove the remaining photoresist layer and the first insulation layer on the remaining photoresist layer;
    S6: forming a first transport layer, and making the first transport layer cover the upper surface of the first insulation layer and the semiconductor substrate in the first partial region;
    S7: forming an interface layer on the first transport layer; wherein the interface layer plays a role of insulation;
    S8: forming a light-emitting material layer on the interface layer;
    S9: forming a second insulation layer, and making the second insulation layer cover a light-emitting material layer in the second partial region and a light-emitting material layer near a second partial region side in the first partial region, and not cover a central region in the first partial region; wherein an area of the central region is less than an area of the first partial region; comprising:
    adjusting a size of the light-emitting material layer covered by the second insulation layer in the first partial region, to adjust the area of the central region; and
    S10: forming an electron transport layer only in the central region of the first partial region.

2. The manufacturing method of the optoelectronic device according to claim 1, further comprising S11: forming a metal electrode on the electron transport layer in the central region of the first partial region, and extending the metal electrode to the second insulation layer at one side of the central region.

3. The manufacturing method of the optoelectronic device according to claim 1, wherein the light-emitting material layer is a perovskite material layer.

4. The manufacturing method of the optoelectronic device according to claim 1, wherein the light-emitting material layer is a combination of perovskite materials and one or more of organic materials, III-V materials, II-VI materials, IV materials, rare earth materials, oxide materials, semiconductor nanomaterials and insulation materials.

5. The manufacturing method of the optoelectronic device according to claim 1, wherein the first transport layer is a hole transport layer.

6. The manufacturing method of the optoelectronic device according to claim 1, wherein the material of the first insulation layer is any one of silicon dioxide, aluminum oxide, silicon nitride, silicon carbide and aluminum nitride, or a combination of multiple materials.

7. The manufacturing method of the optoelectronic device according to claim 1, wherein the light-emitting material layer is in direct contact with the interface layer.

8. The manufacturing method of the optoelectronic device according to claim 1, wherein the size of the electron transport layer is adjusted by adjusting the size of the light-emitting material layer covered by the second insulation layer in the first partial region and adjusting the size of the central region not covered by the second insulation layer in the first partial region.

9. The manufacturing method of the optoelectronic device according to claim 1, wherein the position where the second insulation layer is formed is limited by the mask, so that only the light-emitting material layer near a second partial region side in the first partial region is covered by the second insulation layer.

10. The manufacturing method of the optoelectronic device according to claim 1, wherein the position where the electron transport layer is formed is limited by the mask, so that the electron transport layer is only formed in the central region of the first partial region.

* * * * *